United States Patent
Duignan

(10) Patent No.: US 6,862,490 B1
(45) Date of Patent: *Mar. 1, 2005

(54) DLL CIRCUIT TAKING ACOUNT OF EXTERNAL LOAD

(75) Inventor: Michael T. Duignan, Washington, DC (US)

(73) Assignee: Potomac Photonics, Inc., Lanham, MD (US)

(*) Notice: Subject to any disclaimer, the term of this patent is extended or adjusted under 35 U.S.C. 154(b) by 0 days.

This patent is subject to a terminal disclaimer.

(21) Appl. No.: 09/744,172
(22) PCT Filed: May 24, 2000
(86) PCT No.: PCT/US00/09816
§ 371 (c)(1), (2), (4) Date: Jan. 19, 2001
(87) PCT Pub. No.: WO00/72221
PCT Pub. Date: Nov. 30, 2000

Related U.S. Application Data

(60) Provisional application No. 60/135,488, filed on May 24, 1999.

(51) Int. Cl.[7] .......................... G06F 19/00; B23K 26/16
(52) U.S. Cl. ................ 700/121; 219/121.6; 219/121.68
(58) Field of Search ................................. 700/114, 119, 700/121, 123, 163, 166, 170; 438/13, 940, 949; 219/121.6, 121.68

(56) References Cited

U.S. PATENT DOCUMENTS

| 5,319,183 | A | * | 6/1994 | Hosoya et al. ......... 219/121.68 |
| 5,389,196 | A | * | 2/1995 | Bloomstein et al. .......... 216/66 |
| 5,643,472 | A | * | 7/1997 | Engelsberg et al. ........... 216/65 |
| 6,025,110 | A | * | 2/2000 | Nowak ....................... 430/200 |
| 6,583,381 | B1 | * | 6/2003 | Duignan ................ 219/121.69 |
| 6,649,861 | B2 | * | 11/2003 | Duignan .................. 219/121.6 |

* cited by examiner

Primary Examiner—Leo Picard
Assistant Examiner—Douglas S. Lee
(74) Attorney, Agent, or Firm—Rosenberg, Klein & Lee

(57) ABSTRACT

Apparatus (10) for performing patterned cleaning of substrate surfaces (11) includes substrate (11), energetic beam (12) directed to the substrate (11), material carrier element (14) having a deposition layer (16), and a control unit (8) operating the apparatus (10) in either a "material removal" or a "material transfer" mode in a predetermined sequence. In the "material removal" mode, the following steps are followed which include the material carrier element (14) from the intersection with the energy beam (12) and allowing impinging of the energy beam (12) on the surface of the substrate in a predetermined patterned fashion so that the material of the substrate is disintegrated at predetermined locations of the substrate surface (11). After the first cleaning, the control unit (18) changes the mode of the operation to the "material transfer" by moving the material carrier element (14) into position intersecting with the energy beam (12) so that the material of the deposition layer (16) is deposited on the surface of the substrate (11).

30 Claims, 7 Drawing Sheets

DLL CIRCUIT TAKING ACOUNT OF EXTERNAL LOAD

REFERENCE TO RELATED APPLICATIONS

This Utility Patent Application is based on the U.S. Provisional Application for Patent Ser. No. 60/135,488 filed on May 24, 1999.

FIELD OF THE INVENTION

The present invention relates to an apparatus and method for patterned cleaning used in fabrication of a variety of miniature structures such as semiconductor chips, optical, chemical, biological, environmental, physical, and electromagnetic detectors/sensors, mechanical, electromechanical elements, actuators, as well as a wide variety of different electronic components. Particularly, the present invention relates to an apparatus and technique for patterned cleaning of substrate surface applicable in Direct Write processes.

Additionally, the present invention relates to an apparatus and technique for patterned substrate surface cleaning by irradiation of the substrate surface using an energy beam, such as laser beam, ion beam, or electronic beam.

Still further, the present invention relates to a technique of patterning the surface cleaning, thus allowing cleaning only of the areas of the substrate surface where cleaning is required or is determined to be effective. This insures the efficient utilization of the available energy of the laser (as well as ion or electron) radiation to thus allow cleaning of substrates that may contain sensitive components or areas that are intolerant to the impinging radiation.

The present invention particularly relates to techniques employing Laser Direct Write and Laser Forward Transfer processes to manufacture complex circuits or miniature structures on a wide variety of substrates.

Further, the present invention relates to an apparatus and technique in which cleaning and deposition processes are carried out with the same fabrication tool, without removing the substrate therefrom. In this manner, miniature structures are fabricated by controllably changing the relative position between an energy beam and the substrate to remove a pattern of surface contamination from the substrate or from material previously deposited on the substrate. Subsequently and without removing the substrate from the fabrication tool, the relative position between the energy beam and the substrate is controllably adjusted to transfer a pattern of depositable material to the areas freshly exposed on the substrate surface thus creating desired miniature structures thereon. If needed, and still without removing the substrate from the fabrication tool, the relative position between the energy beam and the substrate may be further adjusted to remove a second pattern of the surface contamination from the substrate and/or from the material transferred to the substrate.

BACKGROUND OF THE INVENTION

Miniaturized electrical components are widely used in a variety of consumer and industrial items, such as TV sets radios, cars, kitchen appliances, computers, etc. Advantages both in performance and price of miniature structures have made them common in the everyday life of consumers. Due to the popularity and need for miniature structures, such as computer chips, optical, chemical, biological, environmental, physical and electromagnetic detectors/sensors, and a variety of different types of passive electronic components, different manufacturing processes have been developed for fabrication of those structures.

These methodologies may include Direct Write processes, such as Laser Forward Transfer, or Laser Induced Forward Transfer techniques which require a depositable material to be transferred toward a substrate and deposited thereon to manufacture a single structure or a plurality of structures on the same substrate.

In the fabrication of miniature structures, subtractive processes using irradiation of the substrate surface-to ablate, evaporate, or otherwise remove material from the workpiece may be employed simultaneously. Laser surface cleaning is a well-known technique for removing surface contaminations such as particulate matter, thin layers of oil, or other organic/inorganic contaminants. Laser surface cleaning is carried out prior to the deposition of a depositable material on the surface of the substrate to promote adherence of the depositable material to the substrate surface and to enhance electrical contact.

Although being well developed and known to those skilled in the art, conventional irradiation surface cleaning has several drawbacks. Particularly; during the irradiation surface cleaning, substantially the entire surface of a substrate may be affected by irradiation including areas containing fragile or sensitive components as well as areas that are intolerant of laser, ion, or electron radiation. Such a wide area impingement may cause damage to the components located on the substrate surface.

Additionally, radiation of the entire substrate is surface consumes more laser energy than needed for the cleaning process, thus reducing the efficiency of the available laser energy.

Another drawback of conventional surface cleaning is encountered when a plurality of different materials exist on the substrate surface requiring different fluences of the laser beam to be cleaned or removed. Usually, these materials are spread over the substrate surface at different locations. Conventional cleaning (in which the entire substrate surface may be irradiated by the laser beam of the same intensity) cannot selectively clean separate areas containing different materials without complicating the process with additional steps such as the use of masks, photoresists, and other blocking mechanisms.

Still another drawback of conventional cleaning processes is related to the necessity of transferring the cleaned substrate from the "cleaning area" to a "deposition area". During substrate transfer from one area to another, physical damage to the workpiece may occur. Additionally, the workpiece may be contaminated and the freshly exposed areas on the surface may be reoxidized, thus substantially reducing yield of high quality devices.

Accordingly, despite certain utility of the conventional manufacturing equipment and techniques for fabrication of miniature structures, particularly surface cleaning, a long-felt need exists for equipment and techniques in which surface cleaning and deposition may be carried out with the same fabrication tool which provides for selective surface cleaning of those areas where it is required or is effective. A need also has existed for insuring efficient utilization of available laser, ion, or electron energy, where the unwanted irradiation of surfaces containing fragile components or areas intolerant of radiation may be avoided as well as where the cleaning of the surfaces containing a plurality of different materials may be carried out in a simple and effective manner.

SUMMARY OF THE INVENTION

It is therefore an object of the present invention to provide a fabrication tool and method for patterned cleaning of a substrate surface in which only required areas of the substrate surface are cleaned, thus avoiding undesirable areas of the substrate surface to be effected by radiation.

It is another object of the present invention to provide an apparatus and technique for patterned clearing of a substrate an using available radiation energy in a highly efficient manner in order to reduce consumption of the radiation energy needed for a manufacturing process which ultimately reduces the cost of the manufacturing process and resulting product.

It is still a further object of the present invention to provide a method and apparatus for patterned cleaning of the substrate surface in which a plurality of different materials are to be cleaned and removed by scanning the energetic or energy beam over the to-be-cleaned areas of the substrate surface in a patterned fashion with simultaneous adjustment of the energy beam intensity as a function of each material located on the substrate surface.

It is still a further object of the present invention to provide an apparatus and technique for fabrication of miniature structures in which both the cleaning process and deposition process are carried out with the same fabrication tool without removing the substrate from the site. This avoids possible physical damage to the workpiece or contamination as well as unwanted reoxidation of freshly exposed areas of the substrate surface thereby increasing the yield of the high quality miniature structures and reducing the cost of and simplifying the manufacturing process.

It is a further object of the present invention to provide an apparatus for fabrication of miniature g structures in which a control unit operates the apparatus in either a "material removal" or "material transfer" mode of operation in order that in the same apparatus, either a cleaning of the surface, or deposition of a depositable material on the cleaned surface of the substrate may be controlled in a predetermined patterned sequence.

It is an object of the present invention to provide an apparatus for manufacturing of miniature structures in which during a "material removal" mode of operation, a control unit controls a direct impingement of the energy beam onto the surface of the substrate in order that the energy beam scans the surface of the substrate in a patterned fashion and selectively removes unwanted material from the substrate surface. Using the same apparatus during the "material transfer" mode of operation, the control unit displaces a source of depositable material in an intercepting path with the energy beam, so that the energy beam impinges the source of depositable material and causes transference of the depositable material towards the surface of the substrate with such being deposited in a patterned fashion onto the areas freshly exposed during the preceding cleaning step.

Another object of the present invention is to provide an apparatus for cleaning of the substrate surface and for manufacturing "miniature structures on a substrate surface in which a carrier gas is supplied to the fabrication tool which purges produced residues. Additionally, an inert cover gas may be supplied to flow through the fabrication tool to prevent reoxidation of freshly exposed areas of the substrate surface thus promoting adhesion of the depositable materials, minimizing material contamination, improving bonding and decreasing electrical contact resistance.

Still further the present invention provides a cleaning process for a substrate surface particularly adaptable for cleaning of surfaces having a plurality of different materials mounted thereon. Simultaneously in this process, the energy beam is "scanned" over the areas where different materials are positioned and the intensity of the energetic beam is fine-tuned as a function of the materials position.

Further the present invention provides a fabrication tool and method for manufacturing miniature structures using a controlled atmosphere and minimized surface exposure time (between patterned cleaning and subsequent deposition) which can greatly improve adhesion of deposited films.

In accordance with the present invention, a fabrication tool for patterned cleaning of a substrate surface includes a substrate, a source of an energy beam directed towards the substrate, a material carrier element having a deposition layer thereon, and a control unit operating the fabrication tool in either a "material removal" mode of operation, or a "material transfer" mode of operation in a specified sequence.

In the "material removal" mode of operation, the control unit changes the relative disposition between the energetic beam and the substrate in accordance with a predetermined pattern to clean the substrate surface in a patterned fashion. After the cleaning step has been performed, the control unit transfers the fabrication tool into the "material transfers" mode of operation by displacing the material carrier element in a position intersecting the energy beam and further changes the relative distance between the energy beam and the substrate in accordance with a predetermined pattern. This pattern may be the same as the pattern of the "material removal" mode of operation, thus transferring the depositable material from the material carrier element towards the substrate and depositing the depositable material on the areas freshly exposed during the cleaning process.

The control unit may further transfer the fabrication tool to another "material removal" mode of operation by displacing the material carrier element away from an interception path with energy beam for further surface cleaning. In this instance, the surface to be cleaned contains deposited miniature structures. In a second surface cleaning, the substrate surface is cleaned in a patterned fashion in accordance with a second pattern (which may be distinct from the first pattern) for further deposition of structures on the freshly exposed areas.

The energy beam may be a laser beam, ion beam, or electron beam. Particularly, the laser beam may be a pulsed ultraviolet beam which due to the short absorption depth of UV radiation, prevents deep penetration and widespread thermal damage of the substrate surface. Ultraviolet radiation may also create ions more effectively than that of radiation at longer wavelengths. The created ions may contribute in static charge neutralization which is believed to be an important mechanism in removing particles from surfaces.

The deposition layer on the material carrier element contains a depositable material which may include powders, metals, composites, alloys, ceramics, a vaporizable substance, molecular precursors, and/or solvents. The materials carrier element is made transparent to the UV radiation to allow direct access for the energy beam to the deposition layer.

A typical substrate may contain many different materials each with different radiation fluence requirement for cleaning. By adjusting the energy beam intensity under computer control through a variable attenuator, acousto-optics modulator, or other means, while moving the workpiece and/or scanning the beam, allows the tailoring or fine-tuning of the energy beam fluence as a function of each material position.

Preferably, the fabrication tool includes a mechanism for supplying either a carrier gas or an inert cover gas flowing through the fabrication tool during the cleaning process for removing residues formed during the surface cleaning and for preventing re-oxidation of areas on the substrate surface freshly exposed during the cleaning.

Another aspect of the present invention is directed to a method of patterned cleaning of a substrate surface in a fabrication tool operated in either a "material removal" mode of operation and/or a "material transfer" mode of operation. The material removal" mode of operation includes the steps of performing a first cleaning of the substrate surface by changing a relative disposition between the energy beam and the substrate in accordance with a first pattern, and performing a second cleaning of the substrate surface by changing a relative distance between the energy beam and the substrate in accordance with a second pattern.

Between the first and second cleaning, the control unit of the fabrication tool positions a material carrier element having a deposition layer into an intercepting path with the energy beam, thus translating the fabrication tool in the "material transfer" mode of operation. By changing the relative distance between the energy beam and the substrate in accordance with the first predetermined pattern there is caused a deposition of depositable material contained in the deposition layer onto the substrate surface at locations freshly exposed during the first cleaning of the substrate surface.

Additionally, the present invention is directed to a method for fabrication of miniature structures in a unique fabrication tool which includes a substrate, a controllable energetic beam directed towards the substrate, a material carrier element having a deposition layer supported thereon facing the substrate, and a control unit operating the fabrication tool in either "material removal" mode of operation and "material transfer" mode of operation in a predetermined sequence. In the material removal mode of operation, the material carrier element is displaced from interception with energy beam and thus provides an unimpeded path for the energy beam to the surface of the substrate. Simultaneously, the relative disposition or distance between the energy beam and the substrate is varied in accordance with a first predetermined pattern.

In the "material transfer" mode of operation following the patterned cleaning, the material carrier element is displaced into interception with the energy beam and the relative distance between the energy beam and the substrate is changed in accordance with the first predetermined pattern, thereby transferring and depositing a depositable material contained in the deposition layer on the surface to, of the substrate cleaned during the first cleaning process.

After the material deposition has been carried out, the manufacturing process continues to the next step of translating the fabrication tool again into the "material is removal" mode of operation and performing the second cleaning by changing the relative disposition or distance between the energy beam and the substrate in accordance with a second predetermined pattern. In the second cleaning, the surface of the substrate includes the structures deposited thereon during the material transfer mode of operation.

During the first or second cleaning process the substrate surface has a plurality of different materials thereon requiring different intensities of the energy beam for their disintegration. The control unit provides not only for the energy beam to scan over the surface of the substrate and/or for the workpiece to move with regard to the energy beam, but also changes the intensity of the energy beam as a function of position of each particular material on the substrate surface.

The technique of the present invention also includes the possibility of controlling atmosphere within the fabrication tool to remove the residues from the surface formed during the cleaning process and to prevent freshly exposed areas from undesired reoxidation by controlling the atmosphere within the fabrication tool and by supplying either carrier gas or inert cover gas flowing through the fabrication tool.

These and other novel features and advantages of this invention will be fully understood from the following detailed description of the accompanying Drawings.

DETAILED DESCRIPTION OF THE PREFERRED EMBODIMENT

The present invention provides a unique implementation and enhances the ability of laser direct write (LDW) and laser forward transfer (LFT) processes to create complex circuits or structures in a conformal manner on virtually any substrate. Surface cleaning promotes adhesion of deposited materials, minimizes material contamination, improves bonding, and decreases electrical contact resistance.

Patterning the surface cleaning through a direct write process, according to the present invention, permits cleaning only those selective areas where it is required or will be effective. This helps to insure efficient utilization of available laser energy and allows cleaning of substrates that might contain fragile or sensitive components and/or areas that are intolerant of laser radiation.

Figure 1:
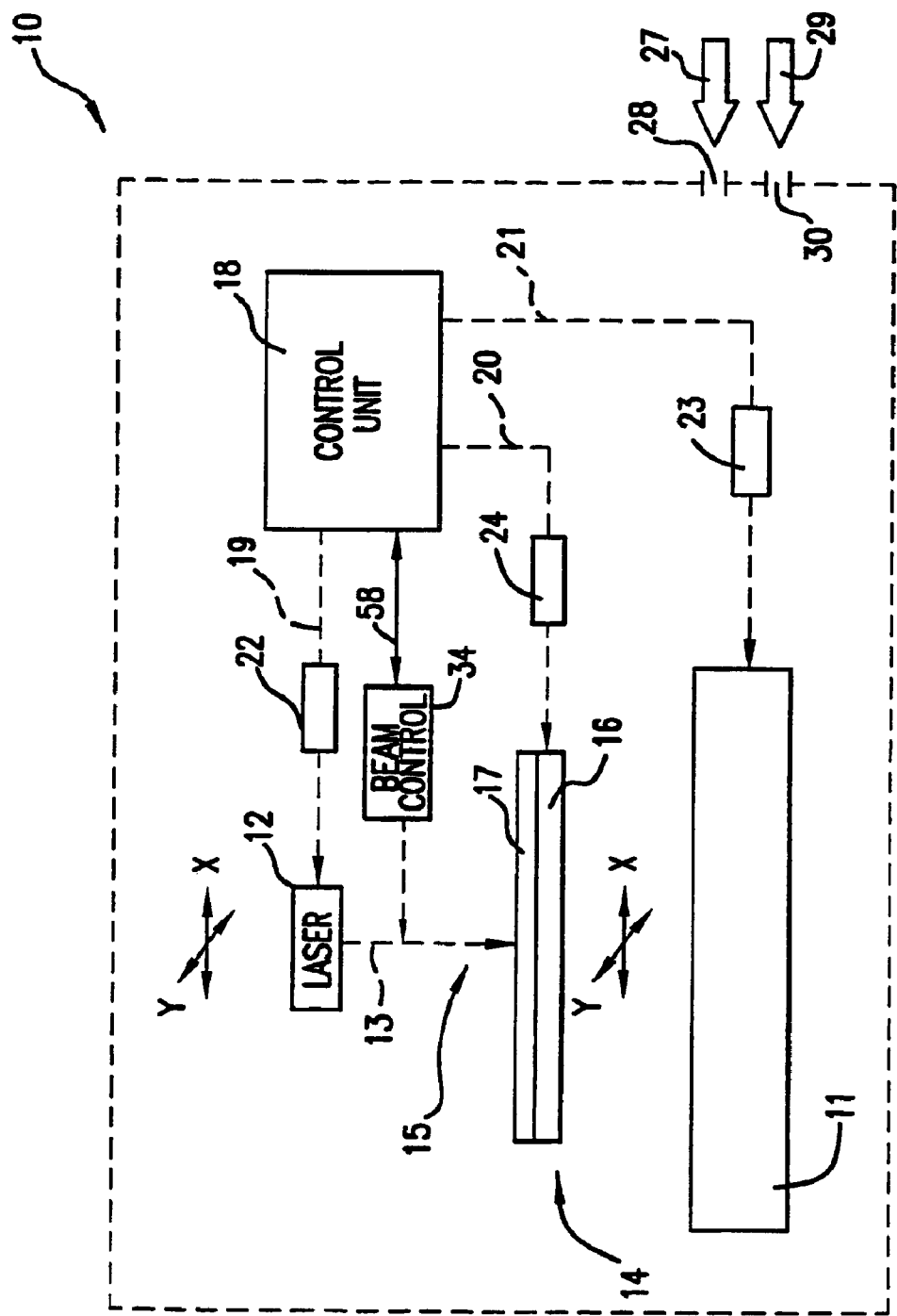
FIG. 1 is a schematic representation of the apparatus for fabrication of miniature structures of the present invention.
Figure 2C:
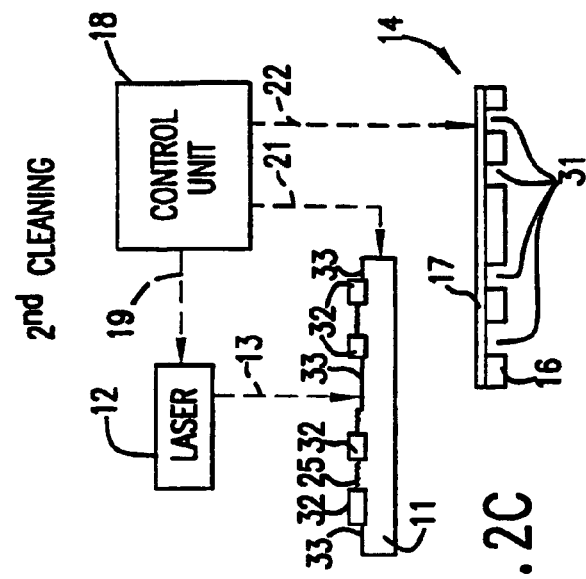
FIG. 2C is a schematic representation of the apparatus of the present invention operating in a "material removal" mode of operation to perform a second surface cleaning.

Referring to FIGS. 1–2C, the apparatus 10 of the present invention includes a substrate 11, a source of energy 12 capable of generating an energy beam 13, a material carrier element 14 which is displaceably located in a gap 15 formed between the source of energy 12 and the substrate 11, a deposition layer 16 supported on the surface 17 of the material carrier element 14, and a control unit 18. The control unit 18 is operatively coupled to the source of energy 12 through a transmission link 19 and to the material carrier element 14 through the communication link 20. Alternatively, the control unit 18 may be operatively coupled to the substrate 11 through the communication link 21.

The control unit 18 actuates the source of energy 12 through the communication link 19 to generate the energy beam 13, regulates the parameters of the energy beam 13 such as fluence, etc., and changes relative position between the energy beam and the substrate in a patterned manner. Accordingly, the control unit 18 "scans" the energy beam 13 over the surface of the substrate 11 either by moving the source of energy 12 in X-Y directions or by changing angular relative disposition of the energy beam 13 with regard to the substrate 11 in a predetermined pattern.

In order to change relative disposition between the energy beam 13 and the substrate 11 in a patterned manner, the control unit 18 alternatively can control the workpiece (substrate) 11 through the communication link 21 by either maintaining the energy beam immovable or displacing the energy beam in a coordinated manner with the substrate.

In order to provide the control unit 18 with a means of manipulating the energy beam 13, the communication link includes an electromechanical mechanism 22 known to those skilled in the art, which is a unit translating the electrical signal from the control unit into mechanical or optical displacement of the source of energy 12. In the same manner, the communication link 21 has an electromechanical mechanism 23 which translates the electrical signal from the control unit 18 into the mechanical displacement of the substrate 11 in a patterned manner.

Through the communication link 20, the control unit 18 manipulates the material carrier element 14 within the gap 15 along the X-Y directions so that the material carrier element 14 may be displaced either away from any interception with energy beam 13 or to a position intercepting with the energy beam 13. Similar to the mechanisms 22 and 23, a mechanical displacement unit 24 is included within the communication link 20 to translate the signal generated by the control unit 18 into the mechanical displacement of the material carrier element 14.

The control unit 18, as will be discussed in detail in further paragraphs, operates the apparatus 10 of the present invention in two modes of operation: "material removal" mode of operation and "material transfer" mode of operation. In the "material removal" mode of operation, the material carrier element 14 is displaced away from interception with the energy beam 13, while in the "material transfer" mode of operation, the material carrier element 14 intercepts the energy beam 13 path. Thus, the apparatus 10 of the present invention performs both as a Direct Write and a micromachining (DW/MM) machine and possesses the ability to accomplish pattern tasks such as laser surface cleaning as well as direct deposit of metal, ceramics, polymers, etc. in situ, in an air atmosphere and at room temperature.

In the "material removal" mode of operation, a patterned cleaning process of the present invention is carried out, while in the "material transfer" mode of operation, miniature structures are formed by depositing a depositable material from the deposition layer 16 onto the surface of the substrate.

The control unit 18 may be utilized to change the mode of operation of the apparatus 10 in any required sequence. For example, as best shown in FIGS. 2A–2C, the control unit 18, first sets the apparatus 10 in a material "removal" mode of operation by displacing the material carrier element 14 from interception with energetic beam 13 and performs a first patterned cleaning by changing the relative disposition between the energetic beam 13 and the substrate 11 in accordance with a first predetermined pattern (as particularly shown in FIG. 2A).

After the first cleaning has been carried out, the control unit 18 changes the mode of operation of the apparatus 10 into the "material transfer" mode of operation by moving the material carrier element 14 into a position intercepting the energy beam 13. A deposition step of the method of the present invention is performed by changing relative distance or disposition between the energy beam 13 and the substrate 11 in accordance with the first predetermined pattern, thereby depositing a depositable material contained in the deposition layer 16 of the material carrier element 14 onto the substrate surface at locations freshly exposed during the first cleaning, as best shown in FIG. 2E.

After the "material transfer" mode of operation has been accomplished, the control unit 18 changes the mode of operation of the apparatus 10 back to the "material removal" mode of operation by displacing the material carrier element 14 from interception with the energetic beam 13 which allows direct access of the energy beam 13 to the surface of the substrate 11. The substrate 11 now has deposited films formed thereon, and by changing relative disposition between the energy beam 13 and the substrate 11 in accordance with a second predetermined pattern, cleaning in a patterned fashion the surface of the substrate 11 is accomplished, as shown in FIG. 2C. The second pattern of the second cleaning usually differs from the first pattern of the first cleaning.

Figure 2B:
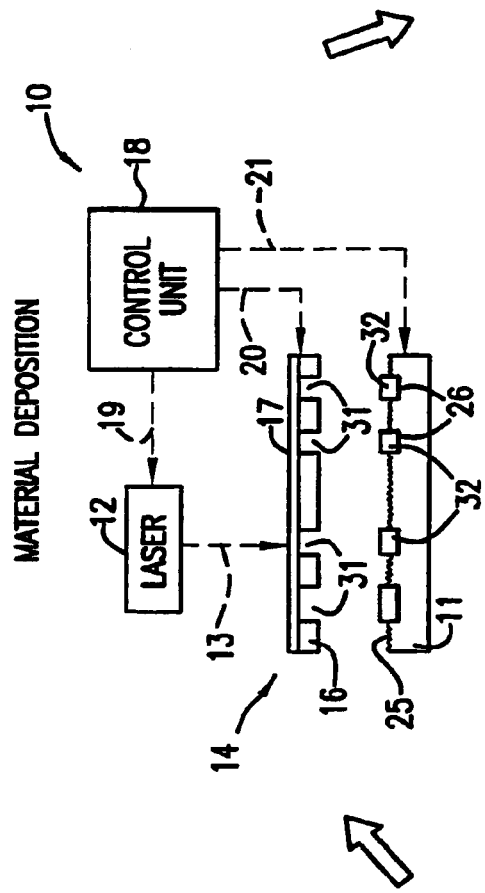
FIG. 2B is a schematic representation of the apparatus of the present invention operating in a "material transfer" la mode of operation in which the material deposition is carried out.
Figure 2A:
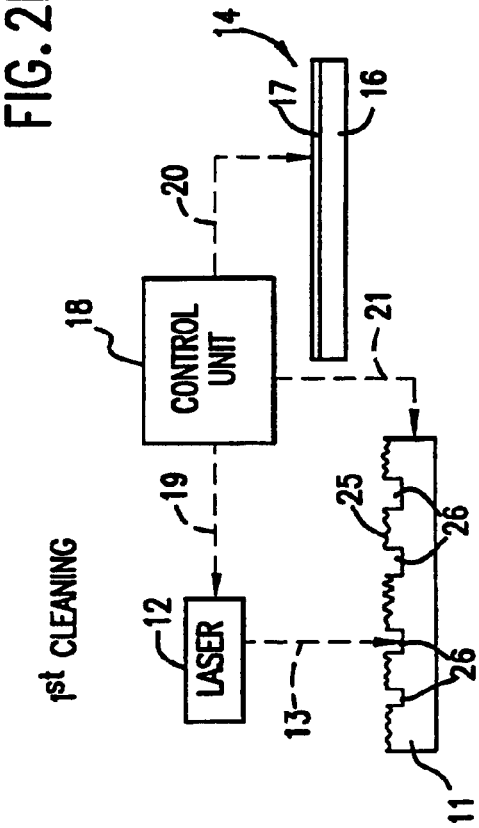
FIG. 2A is a schematic representation of the apparatus of the present invention operating in "material removal" mode of operation to perform a first surface cleaning.

Although not shown in FIGS. 2A–2C, the manufacturing process may be continued so that after the second cleaning, the control unit 18 will change the mode of operation of the apparatus 10 back into the "material transfer" mode of operation for depositing structures on the areas freshly exposed during the second cleaning. The manufacturing process of the present invention, thus may continue in this manner and may include a plurality of intermittent "material removal" and "material transfer" modes of operations performed in a required sequence for fabrication of multilayered or stacked miniature structures known to those skilled in the art.

One of the major advantages of the apparatus and technique of the present invention is that the substrate 11 does not have to be moved from its position when the modes of operation of the apparatus 10 are changed so that any physical damages associated with transportation of the substrate as well as contamination and reoxidation of the ire freshly exposed areas of the surface of the substrate is avoided.

As shown in FIG. 2A, illustrating the first cleaning performed in a "material removal" mode of operation, the material carrier element 14 is displaced by the control unit 18 from interception with energy beam 13 whereby the energy beam 13 generated by the source of energy 12 impinges directly upon a surface 25 of the substrate 11. Although shown completely removed from the gap 15, the material carrier element 14 may alternatively remain within the gap 15 during the "material removal" mode of operation. In this instance, care must be taken to avoid interception of the deposition layer 16 with the energy beam 13 in order to allow direct access or a free path of the beam 13 to the substrate 11.

The untreated surface 25 of the substrate 11 may include different contaminations such as particulate matter, thin layers of oils, oxide layers, or other organic contaminants. Thus prior to the cleaning process, the outermost layer of the material on the surface of the substrate 11 is cleaned and removed before the deposition of intended materials in order to provide effective adhesion of the depositable materials to the surface of the substrate 11.

Therefore, in the first cleaning process, shown in FIG. 2A, the energy beam 13 impinges on the surface 25 of the substrate 11 in a predetermined patterned fashion or manner and removes contaminants or other unwanted materials from the surface 25 at locations 26 thereof under "supervision" of the control unit 18 which changes relative disposition between the energy beam 13 and the substrate 11.

The control unit 18 includes processing means which store in memory predetermined patterns for cleaning the surface 25, i.e., "prescribed paths" for the energy beam 13 and which changes the relative disposition between the energy beam 13 and the substrate 11 according to the stored data.

As discussed in previous paragraphs, the control unit 18 may change the relative disposition between the energetic beam 13 and the substrate 11 in three ways: either scanning the energy beam 13 over the surface of the substrate 11 through the communication link 19; moving the substrate 11 through the communication link 21; or both in coordinated fashion. The control signal is transmitted from the control unit 18 to the source of energy 12 or to the substrate 11 and translated by the mechanism 22 and the mechanism 23, respectively, into mechanical displacement of the energy beam 13 or the substrate 11 and such signal generated in accordance with the data recorded in the memory of the control unit 18.

During the cleaning process, carrier gas 27 is supplied into the apparatus 10 through the inlet 28 (best shown in FIG. 1) to purge the laser produced residue formed on the surface 25 of the substrate 11. At the end of the cleaning process when the freshly exposed areas at locations 26 are vulnerable to the atmosphere within the fabrication tool of the apparatus 10, an inert cover gas 29 is supplied into the apparatus 10 either through the inlet 28 or through a separate inlet 30 which flows through the apparatus 10 to prevent reoxidation of freshly exposed materials at locations 26 that might otherwise rapidly. diminish the possibility of bonding of the depositable material to the surface 25.

When the first cleaning process has been completed, the control unit 18 changes the mode of operation of the apparatus 10 to the "material transfer" mode of operation, best shown in FIG. 2B by moving the material carrier element 14 into the gap 15 formed between the substrate 11 and the source of energy 12.

In this mode of operation, the control unit changes a relative disposition between the energy beam 13 and the substrate 11 (either by scanning the energy beam 13 with respect to the immovable substrate 11, or by moving the substrate 11 with respect to the immovable energy beam 13, eat or moving both the beam 13 and the substrate 11).

The energy beam, thus, impinges upon the material carrier element 14 which is transparent to the radiation and modifies the deposition layer 16 so that the depositable material contained in the deposition layer 16 transfers from spots 31 onto the surface 25 of the substrate 11 and is deposited thereon, particularly at locations 26 freshly exposed on the surface 25 of the substrate 11 during the first cleaning process.

In this manner, miniature structures 32 (deposition films) forming electrical components are created at the predetermined locations on the surface of the substrate. Since the deposition takes place at locations freshly opened during the cleaning process, the deposition structures 32 have improved adhesion of the deposited materials to the surface 25. This improves bonding thereto and minimizes material contamination at the border between the deposited structures 32 and the surface 25 at the locations 26.

The transferred pattern of depositable material and the first pattern of removed surface contamination (during the first cleaning) may be substantially the same. The deposition layer 16 includes a depositable material, such as powders, metals, composites, alloys, ceramics, vaporizable substances, molecular precursors and/or solvents.

In many embodiments, the deposition layer 16 includes a vaporizable substance which rapidly decomposes when exposed to the energy beam 13 to propel the other constituents of the deposition material to the substrate 11. Powders can be comprised of a distribution of powder sizes to enable a closely packed matrix. The molecular precursors can react to reduce an externally generated densification energy which can be thermal or optical (coherent or incoherent light); or have an exothermic reaction when activated from the energy beam 13.

Once the deposition of miniature structures 32 have been accomplished, another cleaning process may be needed, as shown in FIG. 2C. To perform the second cleaning, the control unit 18 changes the mode of operation of the apparatus 10 to the "material removal" mode of operation by removing the material carrier element 14 from the interception with the energy beam thus allowing a direct access of the energy beam 13 to the surface 25 of the substrate 11. In the second surface cleaning, the control unit 18 changes the relative interposition between the energy beam 13 and the substrate 11 (either by scanning the energy beam 13, or by moving the substrate 11, or both) in a patterned fashion according to a second predetermined pattern which may differ from the first pattern in order to clean the surface 25 of the substrate 11 at other locations 33 different from locations 26 exposed during the first cleaning process. In the second surface cleaning, not only the surface 25 of the substrate 11 is subjected to the cleaning process, but the surfaces of the miniature structures 32 also may be cleaned by the energy beam 13 In order to prepare them for further depositions if needed.

The "material removal" mode of operation, as shown in FIGS. 2A and 2C, are set by removing the material carrier element 14 from the gap 15 formed between the source of energy 12 and the substrate 11 in order not to interfere with the energy beam 13. During the material removal" mode of operation, it is not necessary to completely remove the material carrier element 14 from the gap 15. It is possible to keep the material carrier element 14 within the gap 15 so that the control unit 18 moves the material carrier element 14 during the cleaning process within the gap 15 maintaining, at each instance, the deposition layer 16 away from intercepting with the beam 13 thus allowing direct access of the energy beam 13 to the surface of the substrate 11.

A typical substrate 11 may contain many different materials each with different fluence requirements for cleaning. Adjusting the energy beam intensity under the control of the control unit 18 through a beam controller 34, which may include a variable attenuator, or acousto-optic modulator, or other means known to those skilled in 10, the art (best shown in FIGS. 1, and 3–6), while moving the substrate 11 or scanning the beam 13, permits the tailoring or fine-tuning of the energy beam fluence as a function of position of the different materials on the surface 25 of the substrate 11.

The source of energy 12 may be any one of laser, ion gun, or electron gun. When the energy beam 13 is a laser beam, it is preferred that an ultraviolet pulsed excimer laser beam is used for the cleaning process of the present invention. This is due to the fact that short absorption depths of ultraviolet radiation, typically a few nanometers or less, prevents deep penetration and widespread thermal damage.

Ultraviolet radiation can also create ions more effectively than that of longer wavelengths which contribute to static charge neutralization which is believed to be an important mechanism in removing particles from the surface 25 of the substrate 11.

Pulsed ultraviolet lasers are preferred sources of energy for laser surface cleaning of the present invention. The short absorption depths in most materials and the small minimum spot (or feature) size (proportional to wavelength) give ultraviolet lasers many advantages for both the laser forward transfer process and the laser machining process (material removal). The ultraviolet laser, such as an excimer laser, may be pulsed preferably at a rate above 10 Hz and may have a pulse width shorter than 10 microseconds. The ability to exploit all of these technologies is inherent in the design of the apparatus 10 of the present invention.

Since both the material removal (cleaning) and the material deposition are carried out in the same fabrication tool, the surface exposure time between patterned cleaning and subsequent deposition is substantially minimized. Additionally, there is provided the capability to control the atmosphere within the fabrication tool 10 which greatly improves adhesion of deposited films 32 to the cleaned surface of the substrate 11. The system may operate at ambient pressure and temperature and may have a controlled atmosphere (oxidizing, reducing, or inert).

The apparatus 10 and the technique of the present invention employing laser Direct Write and Laser Forward Transfer techniques, also referred to as Direct Write technologies, offer great potential for high resolution and high speed pattern deposition of a wide range of materials on virtually any flat or three-dimensional (3-D) substrate. The speed of the process can be limited only by the criterion of how fast multiple laser spots can be overlapped. This is an environmentally safe, energy efficient and dry process which can change between different materials as quickly as the materials carrier element can be mechanically translated into the optical path of the energy beam 13. The base equipment of the apparatus 10, which is Direct Write equipment and Micromachining equipment, can be easily computer-controlled and in CAD/CAM compatible. The ability to micromachine (in the "material removal" mode of operation), can prove to be crucial when tight tolerances demand in situ component trimming. The same CAD/CAM control used to pattern deposition of the depositable material or position of the energetic beam can be exploited to create optimum "tool paths" for the cleaning laser 12.

Due to the fact that the apparatus 10 and the technique of the present invention is an optically based approach, it lends itself to several in situ optical diagnostics, i.e., ellipsometry, FTIR, optical pyrometry, etc.

The apparatus 10 and the technique of the present invention employs both pattern additive and subtractive process in a single machine, in which different products can be manufactured: mechanical, electromechanical, sensor, or electrical devices; electrical elements that can be formed include resistors, capacitors, sensors, inductors, antennae, or batteries. Also during the subtractive process, the apparatus of the present invention creates holes, vias, waveguides, registration marks, gratings, scribe lines, etchings, trimming, in addition to surface cleaning which already have been described in previous paragraphs. The system of the present invention may be used with only a single rough alignment and can be accomplished without registration marks since fabrication which requires extremely accurate alignment may be completed without removing the substrate from the apparatus 10.

The advantages of the fabrication technique of the present invention have been attained due to the design of the apparatus 10, and particularly due to a functional performance and operational approach of the control unit 18, best shown in FIGS. 3–7. The control unit 18 coordinates all aspects of deposition/ablation process;
  provides interfacing for an operator control and monitoring;
  monitors all critical subsystems (including optical systems) of the apparatus 10 for quality control and safety;
  provides communication with external systems and databases, both internal and external; and
  provides for compatibility with CAD/CAM control.

Figure 3:
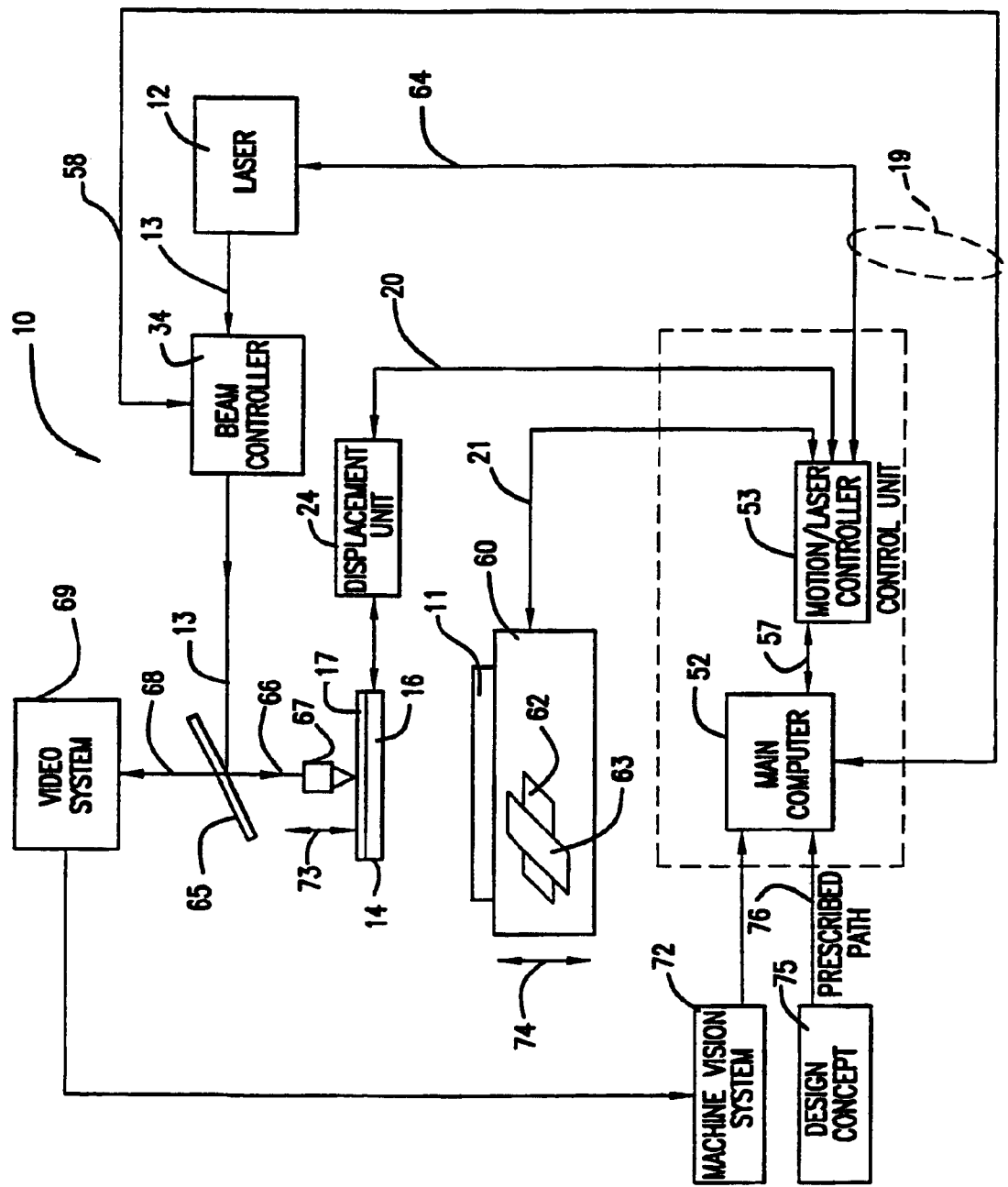
FIG. 3 is an overall block diagram of the apparatus of the present invention.

Referring to FIG. 3, showing the overall block diagram of the system of the present invention, the control unit 18 includes a main computer 52, motion/laser controller 53, and a beam controller 34. The main computer 52 interchanges data with the motion/laser controller 53 through the bi-directional communication channel 57.

The motion/laser controller 53 is external or internal to the main computer 52, provides accurate (approximately 1 micron) dynamic closed loop position control of the substrate, material carrier element position, and scanning is laser beam. The motion-laser controller 53 moves the substrate with high speed (up to 1 meter per second) and accuracy (approximately 1 micron) as well as provides for smoothness of travel for patterned deposition or ablation micromachining. Also, the main computer 52 communicates with the beam controller 34 through the bi-directional communication channel 58.

A substrate fixture 60 includes stages 62 and 63, best shown in FIGS. 3 and 4, which being controlled by the motion/laser controller 53, provide for a required displacement of the substrate 11 in accordance to a prescribed path, as will be described in detail in further paragraphs with reference to FIG. 4. The substrate fixture 60 provides for holding the substrate reliably, keeps it at a required level, controls its temperature as well as atmosphere. For controlling and monitoring the displacement and position of the substrate 11, the bi-directional communication link 21 operatively couples the stages 62 and 63 of the substrate fixture 60 with the motion/laser controller 53 to convey control signals to the it) fixture 60 and readings of the position to the motion/laser controller 53.

The motion/laser controller 53 further communicates with the material carrier element 14 through the bi-directional communication channel 20 which has included therein the mechanism 24 responsible for mechanical displacement of the material carrier element 14 either into intercepting position with the laser beam 13 (in the "material transfer" mode of operation) or away from interception with the laser beam 13 (in the "material removal" mode of operation). The mechanism 24 also changes a position of the material carrier element with regard to the laser beam 13 according to the prescribed path for attaining the effective utilization of the depositable material of the deposition layer 16, deposition of a specific depositable material contained in the deposition layer 16, and deposition of the depositable material on an aimed area of the substrate 11. Depending on the type of the material carrier element 14, the mechanism 24 has a distinctive design features adapted for the particular type of the material carrier element 14 as prescribed by the motion/laser controller 53 through the channel 20. The mechanism 24 may include "reel-to-reel" mechanism, spinning-sliding vacuum system, or other motion actuating mechanisms.

Figure 5:
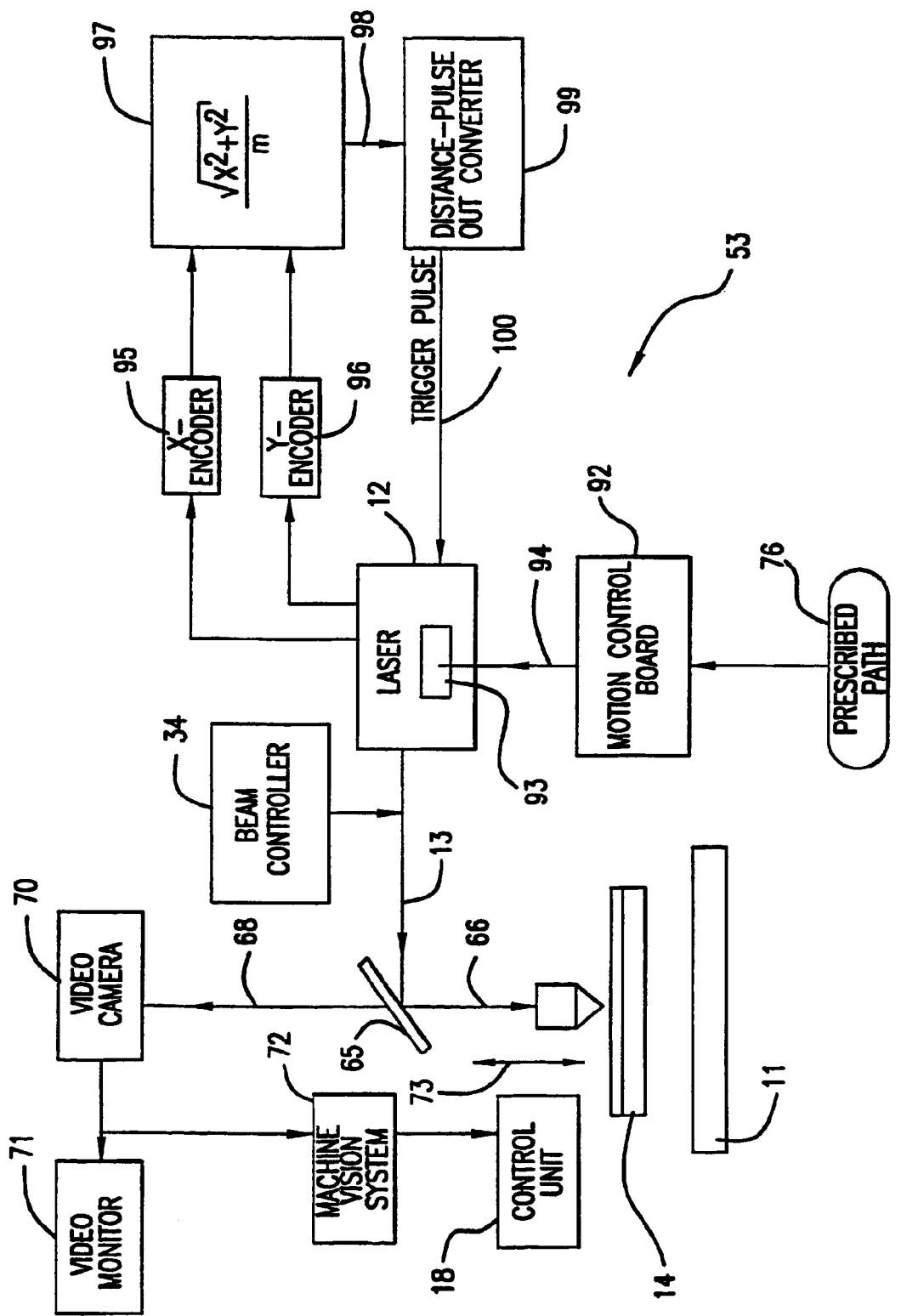
FIG. 5 is a block diagram of a controller subsystem for laser motion and laser actuation-deactuation control of the apparatus of the present invention.

The control unit 18, as can be seen in FIG. 3, is it operatively coupled to the laser system 12 through the communication channel 19 which includes the communication channel 58 for providing coupling between the main computer 52 and the beam controller 34, and the communication channel 64 for providing a bi-directional coupling between the motion/laser controller 53 and the laser 12, as will be described in detail further with reference to FIGS. 5 and 6.

The laser 12 provides focusable pulsed energy source serving to:

- transfer material from the deposition layer 16 to the substrate 11 in the "material transfer" mode of operation;
- ablatively remove the material from the surface of the substrate 11 in the "material removal" mode of operation;
- remove foreign material from the substrate and/or prepare and activate from the substrate surface before or after deposition in the "material removal" mode of operation, particularly "cleaning" mode of operation; and
- shape and refine deposited or existing structures to desired dimensions or values in the "material removal" mode of operation, particularly "laser trimming" mode of operation.

As discussed in the previous paragraphs, the ultraviolet pulsed laser is preferred due to superior ablation characteristics for many materials. Specifically, all solid state frequency tripled neodymium-vanadate lasers (radiating at approximately 355 nm), and frequency quadrupled energy laser (radiating approximately at 266 nm) are preferred because they offer high repetition rates, short pulses, sufficient beam quality, high average power, and superior reliability at low maintenance. The laser beam 13 generated by the laser 12, is controlled by the beam controller 34 under the overall control and monitoring of the main computer 52. As disclosed in previous paragraphs, the beam control in embedded in the system 10 of the present invention in order to deliver the laser beam of the desired optimal laser spot size, shape, and fluence to the material carrier element 14 or to the surface of the substrate 11. Beam shape and size determines the resolution and pattern of the deposition or ablation. Once the shape, size and fluence of the laser beam 13 has been attained, the laser beam impinges upon the splitter 65 whereat the laser beam 13 splits into a beam 66 directed to the objective 67 which further focuses the beam 66 and directs the same to either the surface of the material carrier element 14 or to the surface of the substrate 11. The mirror splitter 65 is a highly reflective at laser wavelength but transparent for invisible spectrum for the video system 69. Another portion of the laser beam 13, particularly the beam 68, is directed by the splitter 65 to a video system 69 which includes a video microscope/video camera 70 and a video monitor 71, best shown in FIG. 5. The signal from the video microscope/video camera 70 is supplied through the line 72 to a machine vision system 72 for image capture and processing. The video system/machine vision system permits an operator to accurately position substrate for registration and scaling with existing pattern;

- to measure and inspect the substrate; and
- to facilitate leveling, focusing and displacement of the substrate and the objective 67 in the direction shown by arrows 73 and 74. The optical subsystem of the apparatus 10 of the present invention which includes the video system 69, video microscope/video camera 70, video monitor 71, and the machine vision system 72 is a well-known machine vision technique and is not intended to be described herein in further detail. The data from the machine vision system 72 are transmitted to the main computer 52 for storing, further processing, and for communication with the motion/laser controller 53 through the communication channel 57 for further control of the relative disposition between the elements of the system 10, as well as actuation-deactuation of the laser 12.

Figure 4:
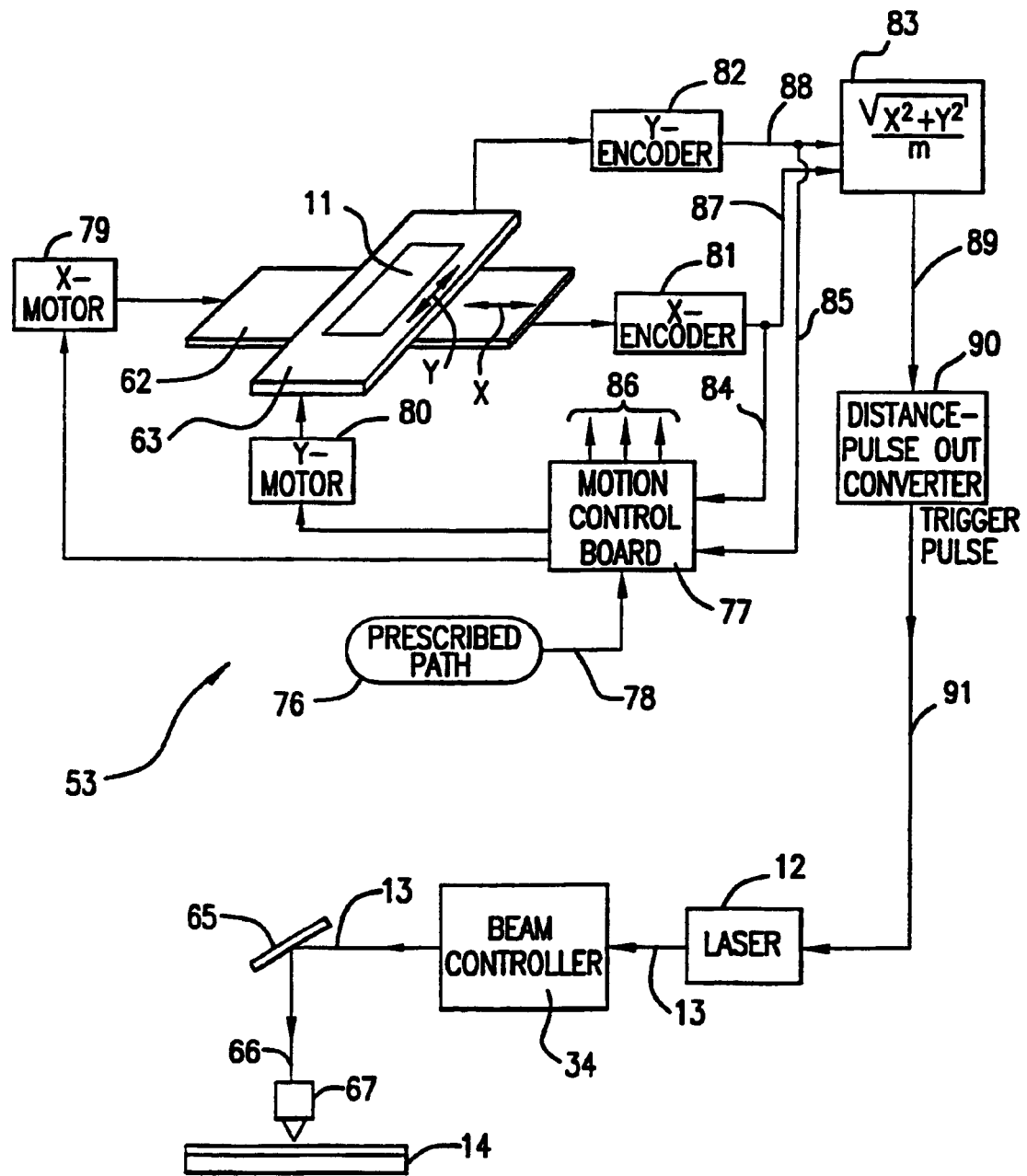
FIG. 4 is a block diagram of a controller subsystem of the apparatus of the present invention coordinating the substrate motion and laser activation-deactivation.

Referring now to FIG. 4, showing a block diagram of the substrate motion/laser controller 53 for substrate motion and laser activation-deactivation control, the motion/laser controller 53, either external or internal to the main computer 52, provides accurate (approximately 1 micron) dynamic closed loop position control of the substrate. In this manner, the controller 53 monitors real time position of the substrate and coordinates the same with generating of laser pulses so that the laser pulses can be triggered with very high alignment accuracy.

It is clear that If the laser beam is delivered at constant repetition rate to either the material carrier element, or the substrate, the pulses tend to "pile up" during acceleration and deceleration of the stages 62, 63, or mechanical displacement mechanism 24, or laser beam displacement mechanism (to be discussed further in detail with the reference to FIG. 5) and makes deposition and ablation depth control difficult. To obviate these unwanted phenomena, the actuation of the laser is to be coordinated with deposition of the substrate, laser beam, and/or material carrier element in real time fashion. As best shown in FIG. 4, the main computer 52, through the motion-laser controller 53, transmits signals representative of a prescribed path (received from the "Design Concept" block 75 of the FIG. 3) which is a CAD/CAM developed design concept for layout of miniature structures cleaning layout) is supplied to the motion control board 77 via a channel 78. The motion control board 77 in accordance with the prescribed path controls an X-motor 79 and a Y-motor 80 to force the stages 62 and 63 carrying the substrate 11 to move the same in required direction a required distance. At the same time, an X-encoder 81 is coupled to the X-stage 62, and the Y-encoder 82 is coupled to the Y-stage 63 for measuring X and Y displacements of the stages 62, 63 and translating them into the format understood by the motor control board 77 is and the processing block 83. The data from X-encoder 81 and Y-encoder 82 are supplied through the channels 84 and 85, respectively to the motion control board for being processed and used for generating various control signals outputted through outputs 86. These control signals may be further transmitted to the optical system of the laser for controlling the laser shutters, laser optical zoom, aperture selection, etc.

Simultaneously, the data corresponding to X and Y displacements of the stages 62 and 63 are transmitted from the X-encoder 81 and Y-encoder 82 through the communication links 87 and 88, respectively, to the processing block 83 wherein the X and Y displacements are processed and calculated according to the formula $$\left(\frac{X^2 + Y^2}{m}\right),$$

wherein X is a displacement of the stage 62, Y is Y displacement of the stage 63 and m is an integer defining the number of pulses for each displacement vector. The data from the processing block 83 is outputted through the channel 89 to a "distance-to-pulse out" converter 90. The converter 90 thus receives vector displacement increment and in response thereto, generates trigger pulse which is transmitted to the laser 12 through the line 91 for actuating-deactuating the laser 12. Thus, the laser 12 generates laser beam 13 once a required displacement of the substrate 11 has been attained. The "distance-to-pulse out" converter 90 is a converter manufactured by Aerotech, Inc. for operation of is the known micromachining stations.

As was described in previous paragraphs, change of the relative disposition between the laser beam, substrate and/or material carrier element, may be implemented in following three fashions:

movement of the substrate with respect to the immovable laser beam; scanning of the laser beam with regard to the substrate and/or material carrier element; and combinatorial motion of the substrate and the laser beam. Thus, when scanning of the laser beam with respect to the substrate and/or material carrier element is chosen for operation, the system 10 of the present invention will operate in accordance with FIG. 5, illustrating the motion/laser controller 53, particularly, a subsystem thereof for laser motion and laser actuation-deactuation control. As shown in FIG. 5, data representative of the prescribed path 76 are supplied to the motion control board 92 (which may coincide with the motion control board 77). The motion control board 92, in the manner described with respect to FIG. 4, transmits control signal over the line 94 either to the optical system of the laser 12 or to mechanical stages carrying the laser 12 for displacement of the laser beam generated by the laser 12, thus providing scanning of the laser beam over the surface of the material carrier element 14 or the substrate 11. X and Y encoders 95 and 96, or other means sensing displacement of the scanning laser beam receive information from the "optical system/tages" unit 93 of the laser 12 and transmit this information to a processing block 97 which processes the information received from the encoder 95, 96 either in the same manner as the processing block 83 of FIG. 4, or in any other fashion known to those skilled in the art, and outputs the data representative of the displacement of the laser beam through the line 98 to the "distance-to-pulse out" converter 90 which in well-know manner converts the data representative of the displacement of the scanning laser beam into the controlling trigger pulses which are supplied to the laser 12 through the line 100 for actuating/deactuating the laser 12. The generated laser beam 13 is further controlled by the beam controller 34 and is further directed to the material carrier element 14 or the substrate 11 as described in the previous paragraphs. In this manner, the firing of the laser beam will be coordinated in precise fashion with the scanning of the laser beam with regard to the substrate 11 or the material carrier element 14.

Figure 6:
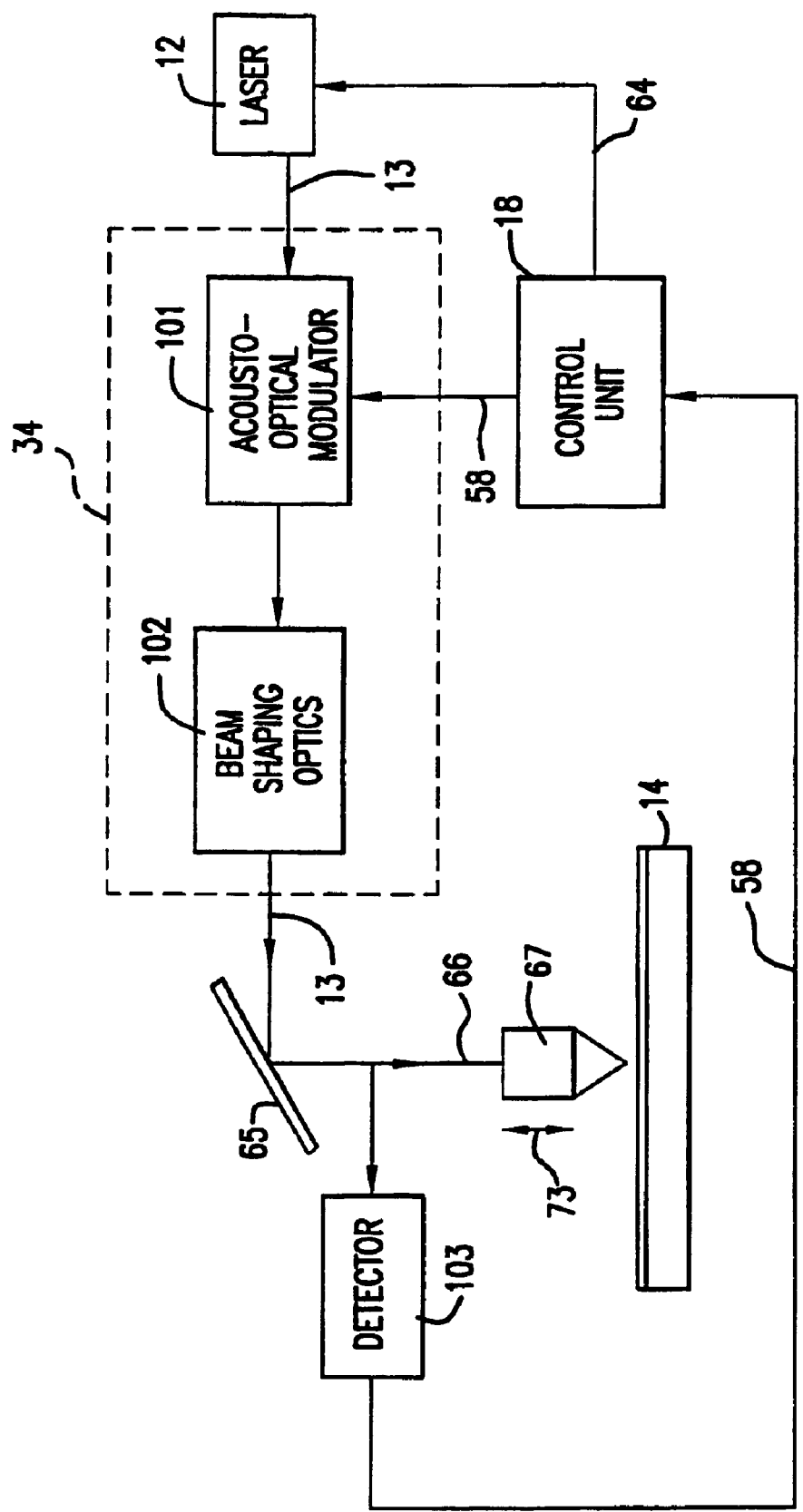
FIG. 6 is a block diagram of the beam control subsystem of the apparatus of the present invention.

Referring to FIG. 6, the beam controller 34 facilitates in delivery of the laser beam of the desired optimal laser spot size, shape, and fluence to the substrate or to the material carrier element. The beam controller 55 includes an acousto-optic modulator 101 coupled to the laser 12 for convenient and efficient way to rapidly (faster than 100 ms) shutter the laser "on" or "off" as well as to control the energy of the individual generated laser pulses dynamically. The acousto-optic modulator 101 external to the laser cavity allows the laser to run at constant repetition rate for maximum stability. Throughput efficiency of the acousto-optic modulator can be controlled by the motion/laser controller 53 in the range between 0% to more than 90%.

A beam shaping optics 102 is coupled to the acousto-optic modulator 101 to control size and shape of the laser beam at the target. The beam shaping optics 102 includes an optical zoom shaped aperture array, and/or diffracted optic beam shaper.

The control of the power and generation of the laser beam is an important feature since fluences of the generated laser beam are to be maintained at different levels for different purposes. For instance, for deposition, an optimal fluence is kept usually in the range of 0.2–2.0 $J/Cm^2$ per pulse. For ablation micromachining, generally high fluences are desired for maximum speed and efficiency, typically approximately 1–100 $J/CM^2$ per pulse. Lower fluences, approximately 0.2–2.0 $J/CM^2$ can be used for precise depth control. Using the structure of the a system of the present invention, sub-micron depth control has been demonstrated.

The laser beam having the required fluence (provided by the acousto-optical modulator 101) and required size and shape (provided by the beam shaping optics 102) is further outputted to the splitter 65 for further traveling to the target (material carrier elements 14 or the substrate 11) through the objective 67. The objective 67 is provided for final imaging of the UV laser beam and video magnification. The objective 67 is mounted on a focusing stage providing displacement in the direction shown by arrows 73 to permit proper imaging regardless of the substrate height, and regardless of whether the material carrier element is in the beam path.

A detector 103 monitors laser pulse energy and supplies data representative of the real time laser beam energy to the control unit 18 for closed loop control.

Figure 7:
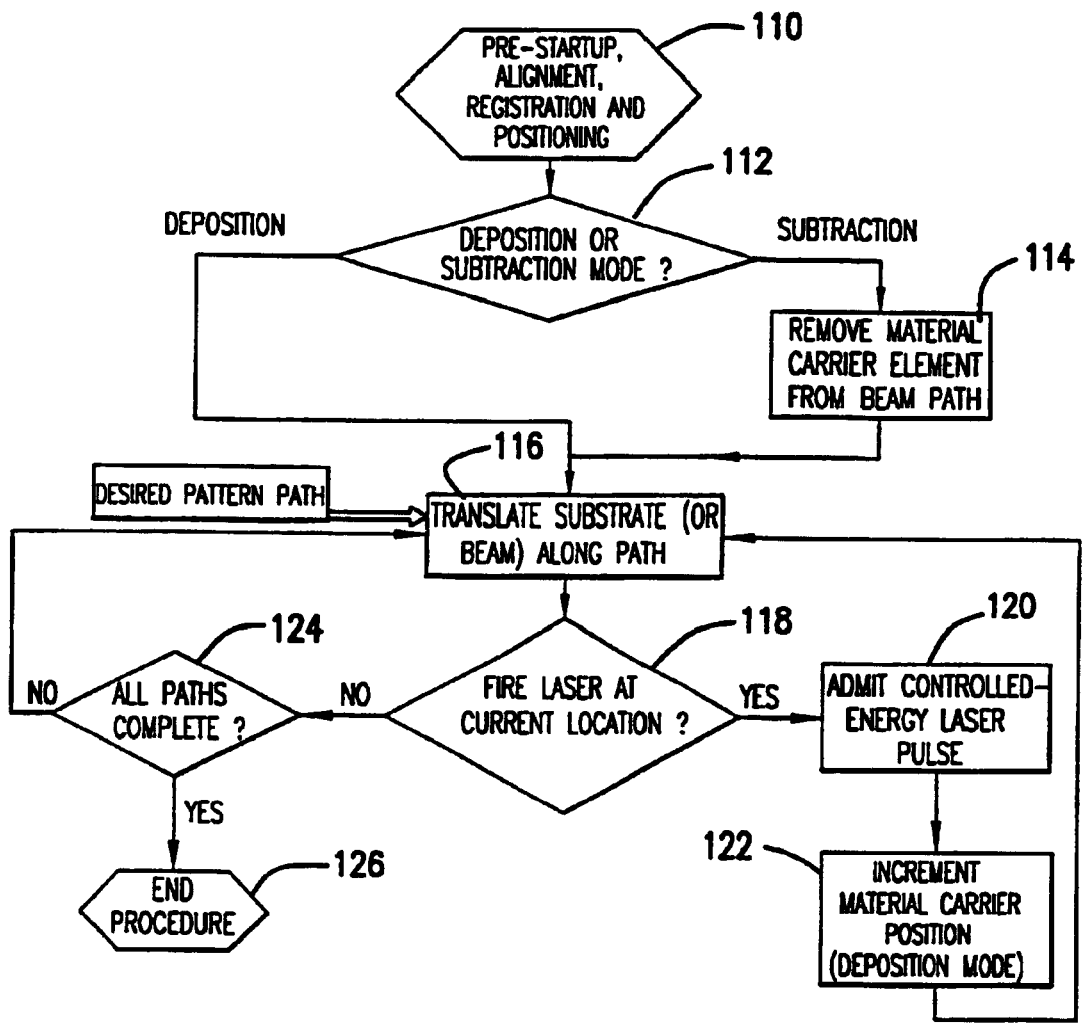
FIG. 7 is a flow chart diagram of the computer program driving the control unit of the apparatus of the present invention.

Referring to FIG. 7, showing a block diagram of the computer operational principles of the control unit of the apparatus of the present invention, the flow chart initiates with the block 110 corresponding to the pre-start-up procedure which includes alignment of the elements (substrate, material carrier element, laser beam) of the system, registration and positioning. Initially, the material carrier element is maintained in an interception path position with the laser. From the block 110, the logic moves to the decision block 112 "Deposition or subtraction mode?" If a subtraction (cleaning mode of operation) is chosen, the logic is directed to the block 114 "Remove material carrier element from the beam path". In accordance with the command of the block 114, the control unit 18 then outputs a control signal to mechanism 24, best shown in FIG. 3, for moving the material carrier element 14 away from the interception position with the laser beam 13.

From the block 114, the logic is directed to the block 116 "Translate substrate (or beam) along prescribed path".

If in the logic block 112, the deposition ("material transfer" mode of operation) is chosen, the operational procedure moves again to the block 116. The logic block 116 receives a desired pattern path which corresponds to the prescribed path 76 best shown in FIGS. 3–5. Thus, upon receiving the desired pattern path, the logic block 116 changes relative disposition between the substrate and the beam in accordance with the prescribed path for cleaning the surface of the substrate.

From the block 116, the flow chart moves to the logic decision block 118 "Fire laser at current location?". If the laser has to be fired, i.e., the answer is "Yes", the logic moves to the block 120 "Admit controlled-energy laser pulse". At this instance, the motion/laser controller 53, as best shown in FIGS. 3–5, "commands" the laser 12 to generate a laser pulse which impinges at a predetermined area of the substrate 11 (in the "material removal" mode of operation for cleaning the substrate), or the material carrier element 14 (in the "material transfer" mode of operation).

After the laser beam modifies either the deposition layer 15 of the material carrier element 14 or the surface of the substrate 11, the flow moves to the logic block 122 "Increment materials carrier position (deposition mode)". In this instance, the control unit 18 deactivates the laser 12, thus seizing the laser beam, and moves the material carrier element 14 to the next position according to the prescribed path 76 if the apparatus 10 operates in the "materials transfer" mode of operation.

If however the apparatus 10 operates in the "cleaning" mode of operation, the control unit 18 seizes the laser beam and moves the substrate to the next position in accordance with the prescribed path 76. Thus, from the logic block 122, the flow chart returns to the logic block 116, where the translation of the substrate (or the laser 4 beam) is performed along with prescribed path 76.

If however the answer to the decision logic block 118 is "No", meaning that the laser is not to be fired at a current location of the substrate or the laser beam, the logic flows to the block 124 "All Paths Complete?". If the answer is "Yes", the logic flows to the "End Procedure" block 126.

If however, in the logic block 124, if it is decided that not all prescribed paths have been yet completed, i.e., the answer is "No", the logic returns to the block 116 to translate the substrate (or the laser beam) along the prescribed path 76 for further leading the flow chart either along the loop comprised of logic blocks 118, 120, 122 and 116; or along the loop comprised of the logic blocks 118, 124, 116, in sequence.

A number of material compositions used in this invention are transparent to laser beams and such compositions, among others, may include fuse silica, borosilicate glass, polyester films such as Mylar, acrylic, as well as a wide variety of other compositions known in the art.

Although this invention has been described in connection with specific forms and embodiments thereof, it will be appreciated that various modifications other than those discussed above may be resorted to without departing from the spirit or scope of the invention. For example, equivalent elements may be substituted for those specifically show and described, certain features may be used independently of other features, and in certain cases, particular locations of elements may be reversed or interposed, all without departing from the spirit or scope of the invention as defined in the appended Claims.

What is claimed is:

1. A method for fabrication of miniature structures, comprising the steps of:
    (a) providing a fabrication tool, including:
        a substrate having a surface,
        an energy beam directed towards said substrate, and
        control means operating said fabrication tool in (1) material removal mode of operation and (2) material transfer mode of operation, in a predetermined sequence;
    whereby when said fabrication tool is in said material removal mode of operation, further providing a direct access of said energy beam to said surface of said substrate and cleaning said surface of said substrate by changing a relative disposition between said energy beam and said substrate in accordance with a first predetermined pattern; and,
    (b) providing a material carrier element having a deposition layer supported thereon and facing said substrate, whereby when said fabrication tool is in said material transfer mode of operation further including positioning said deposition layer in an interception path with said energy beam, and
    changing a relative disposition between said energetic beam and said substrate in accordance with said first predetermined pattern, thereby transferring a deposition material contained in said deposition layer on said surface of said substrate at locations thereon cleaned during said material removal mode of operation.

2. The method of claim 1, further comprising the steps of:
    changing the mode of operation of said fabrication tool to a successive material removal mode of operation following said material transfer mode of operation, and
    cleaning the surface of said substrate by changing relative disposition between said energy beam and said substrate in accordance with a second predetermined pattern.

3. The method of claim 2, wherein said second predetermined pattern differs from said first predetermined pattern.

4. The method of claim 2, wherein the surface of said substrate has deposition material deposited thereon.

5. The method of claim 1, wherein said energy beam includes a laser beam.

6. The method of claim 5, wherein said laser beam includes an ultraviolet laser beam.

7. The method of claim 1, further including the steps of:
    displacing said material carrier element away from interception with said energy beam in said material removal mode of operation.

8. The method of claim 1, further including the steps of:
    maintaining said deposition layer in a position intercepting with said energy beam in said material transfer mode of operation.

9. The method of claim 2, further including the steps of:
    changing the relative disposition between said energetic beam and said substrate by controlling the position of said energy beam relative to said substrate.

10. The method of claim 2, further including the steps of:
    changing the relative disposition between said energy beam and said substrate by controlling the position of said substrate relative to said energy beam.

11. The method of claim 2, further including the step of:
    changing the relative disposition between said energetic beam and said substrate by controlling the positions of said energy beam and said substrate in coordinated fashion.

12. The method of claim 2, in said "material removal" modes of operation, supplying a carrier gas flowing through said fabrication tool to remove residues formed as the result of said cleaning of said substrate surface.

13. The method of claim 2, further including the steps of:
    supplying an inert cover gas flowing through said fabrication tool to prevent areas of said substrate surface freshly exposed during said cleaning of said substrate surface from the re-oxidation.

14. The method of claim 1, wherein said substrate surface includes at least one to be removed therefrom, said method further comprising the step of:
    adjusting, by means of said control means, intensity of said energy beam for removing said at least one material.

15. The method of claim 1, wherein said substrate surface includes a plurality of different materials to be removed therefrom, said method further comprising the step of:
    adjusting, by means of said control means, intensity of said energy beam in accordance with positions of said materials to be removed from said substrate surface.

16. A method of patterned cleaning of a substrate surface, comprising the steps of:

(a) providing a fabrication tool, including:
  a substrate having a surface thereof,
  an energy beam directed towards said substrate, and
  control means operating said fabrication tool in either a material removal mode of operation and a material transfer mode of operation whereby in said material removal mode of operation further performing a first cleaning of said substrate surface by allowing a direct access for said energy beam to said substrate surface and by changing a relative disposition between said energy beam and said substrate in accordance with a first predetermined pattern;
(b) performing a second cleaning of said substrate surface by allowing a direct access for said energetic beam to said substrate surface and by changing a relative disposition between said energy beam and said substrate in accordance with a second predetermined pattern; and,
(c) providing a material carrier element having a deposition layer supported thereon and facing said substrate, between said first and second cleaning steps, positioning said material carrier element into interception with said energy beam, thereby translating said fabrication tool into said material transfer mode of operation, and
  changing relative disposition between said energetic beam and said substrate in accordance with said first predetermined pattern, thereby depositing a deposition material contained in said deposition layer onto said substrate surface at locations therein cleaned during said first cleaning.

17. The method of claim 16, wherein said second cleaning is performed on said substrate surface including at least one deposited structure.

18. An apparatus for patterned cleaning of a substrate surface, comprising:
  a substrate having a surface thereof,
  an energy beam directed towards said substrate, and
  control means operating said apparatus in either a material removal mode of operation and material transfer mode of operation,
  in said material removal mode of operation, said control means change the relative disposition between said energy beam and said substrate in accordance with a predetermined pattern, thus cleaning said substrate surface in a patterned fashion; and,
  a material carrier element positionable in interception with said energy beam in said material transfer mode of operation and away from interception with said energetic beam in said material removal mode of operation, said material carrier element including a deposition layer supported thereon and facing said substrate.

19. The apparatus of claim 18, wherein said energy beam includes a laser beam.

20. The apparatus of claim 19, wherein said laser beam includes a pulsed ultraviolet beam.

21. The apparatus of claim 18, wherein said energy beam includes an electron beam.

22. The apparatus of claim 18, wherein said energy beam includes an ion beam.

23. The apparatus of claim 18, wherein said control means further includes means for adjusting intensity of said energy beam in accordance with a type of material on said substrate surface.

24. The apparatus of claim 19, wherein said substrate surface has a plurality of material disposed thereon, said adjusting means being adapted for adjusting the intensity of said energy beam in accordance with position of each of said plurality of materials.

25. The apparatus of claim 18, further including means for supplying a carrier gas flowing through said apparatus for removing therefrom residues formed during said surface cleaning.

26. The apparatus of claim 18, further including means for supplying an inert cover gas flowing through said apparatus for preventing reoxidation of areas on said substrate surface freshly exposed during said cleaning.

27. The apparatus of claim 18, wherein said control means is operatively coupled to said energy beam to change the position thereof with respect to said substrate.

28. The apparatus of claim 18, wherein said control means is operatively coupled to said substrate to change the position thereof with respect to said energy beam.

29. The apparatus of claim 18, wherein said control means is operatively coupled to said material carrier element for changing the position thereof, thus setting said apparatus in one of said material removal and said material transfer modes operation.

30. The apparatus of claim 18, wherein said control means operates said apparatus in either of said material removal and material transfer modes of operation in a predetermined sequence.

* * * * *

UNITED STATES PATENT AND TRADEMARK OFFICE
CERTIFICATE OF CORRECTION

PATENT NO. : 6,862,490 B1
DATED : March 1, 2005
INVENTOR(S) : Michael T. Duignan It is certified that error appears in the above-identified patent and that said Letters Patent is hereby corrected as shown below:

Title page,
Item [54], Title, change to read, -- PATTERNED SURFACE CLEANING SYSTEM OF MINIATURE STRUCTURES --.

Signed and Sealed this

Twenty-second Day of November, 2005

JON W. DUDAS
*Director of the United States Patent and Trademark Office*